(12) United States Patent
Oyamada et al.

(10) Patent No.: US 10,991,672 B2
(45) Date of Patent: *Apr. 27, 2021

(54) CU ALLOY BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Takashi Yamada, Saitama (JP); Daizo Oda, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/637,653

(22) PCT Filed: Aug. 7, 2018

(86) PCT No.: PCT/JP2018/029589
§ 371 (c)(1),
(2) Date: Feb. 7, 2020

(87) PCT Pub. No.: WO2019/031498
PCT Pub. Date: Feb. 14, 2019

(65) Prior Publication Data
US 2020/0279824 A1 Sep. 3, 2020

(30) Foreign Application Priority Data
Aug. 9, 2017 (JP) .............................. JP2017-154771

(51) Int. Cl.
*H01B 1/02* (2006.01)
*C22C 9/00* (2006.01)
*H01L 23/00* (2006.01)

(52) U.S. Cl.
CPC ............. *H01L 24/45* (2013.01); *H01B 1/026* (2013.01); *C22C 9/00* (2013.01); *H01L 2224/45147* (2013.01)

(58) Field of Classification Search
None
See application file for complete search history.

(56) References Cited

U.S. PATENT DOCUMENTS

| 6,406,566 B1 | 6/2002 | Ishida et al. |
| 2012/0118610 A1* | 5/2012 | Terashima ................ C22C 9/00 174/126.2 |

FOREIGN PATENT DOCUMENTS

| JP | 2001-020026 A | 1/2001 |
| JP | 2014-146622 A | 8/2014 |

(Continued)

OTHER PUBLICATIONS

Decision to Grant a Patent issued in corresponding Japanese Application No. 2019-535670, dated Oct. 29, 2019, with English translation.

(Continued)

*Primary Examiner* — Xiaobei Wang
(74) *Attorney, Agent, or Firm* — McDermott Will & Emery LLP (57) ABSTRACT

The present invention provides a bonding wire for a semiconductor device, where the bonding wire can inhibit wear of capillary. In a Cu alloy bonding wire for a semiconductor device, a total of abundance ratios of a crystal orientations <110> and <111> having an angular difference of 15 degrees or less from a direction perpendicular to one plane including a wire center axis is to crystal orientations on a wire surface 40% or more and 90% or less, in average area percentage.

6 Claims, 1 Drawing Sheet

(56) References Cited

FOREIGN PATENT DOCUMENTS

| | | |
|---|---|---|
| JP | 2016-115875 A | 6/2016 |
| JP | 2017-045924 A | 3/2017 |
| JP | 2017-092078 A | 5/2017 |
| JP | 6618662 B2 | 12/2019 |
| WO | 2015/053128 A1 | 4/2015 |
| WO | 2015/152166 A1 | 10/2015 |
| WO | 2017/026077 A1 | 2/2017 |

OTHER PUBLICATIONS

Notice of Reasons for Refusal issued in corresponding Japanese Application No. 2019-535670, dated Sep. 10, 2019, with English translation.

International Search Report issued in corresponding International Patent Application No. PCT/JP2018/029589, dated Sep. 25, 2018, with English translation.

* cited by examiner

CU ALLOY BONDING WIRE FOR SEMICONDUCTOR DEVICE

CROSS REFERENCE

This application is the U.S. National Phase under 35 U.S.C. § 371 of International Application No. PCT/JP2018/029589, filed on Aug. 7, 2018, which claims the benefit of Japanese Application No. 2017-154771, filed on Aug. 9, 2017, the entire contents of each are hereby incorporated by reference.

TECHNICAL FIELD

The present invention relates to a Cu alloy bonding wire for a semiconductor device, where the Cu alloy bonding wire is used to connect electrodes on semiconductor elements with a circuit wiring board such as external leads.

BACKGROUND ART

Currently, as bonding wires for semiconductor device (hereinafter referred to as bonding wires) for use to bond electrodes on semiconductor elements with external leads, fine wires approximately 15 to 50 µm in wire diameter are mainly used. As a method for bonding the bonding wires, a thermosonic bonding process is used commonly, and a general-purpose bonding machine, a capillary jig, and the like are used, where the capillary jig is used for connection by passing the bonding wire therethrough. A bonding wire bonding process involves heat-melting a wire tip by arc heat input, forming a ball (FAB: Free Air Ball) by surface tension, pressure-bonding the ball portion (hereinafter referred to as ball bonding) to an electrode of a semiconductor element heated in a range of 150 to 300° C., then forming a loop, and pressure-bonding a wire portion to an electrode on the side of the external lead (hereinafter referred to as wedge bonding) to complete the process.

As a bonding wire material, gold (Au) has mainly been used heretofore, but copper (Cu) has come to be used recently. Bonding wires made of Cu are high in electric conductivity and low in cost, and thus adopted in various semiconductor packages. Bonding wires made of Cu are roughly divided into bonding wires having a coating layer of Pd, Au, or another element on the surface of Cu (hereinafter referred to as coated Cu wires) and bonding wires not having a coating layer (hereinafter referred to as bare Cu wires). The coated Cu wires, which inhibit oxidation of copper on wire surfaces, which is a problem with bare Cu wires, have many advantages in terms of use performance. Therefore, the coated Cu wires are often adopted in high-density LSI applications that involve small wire diameter and have stringent performance requirements, in particular. On the other hand, the bare Cu wires, which are less costly than the coated Cu wires are mainly adopted in power device applications that involve large wire diameter and have relatively low performance requirements.

On the one hand, by taking advantage of cost benefits of the bare Cu wires, there have been attempts to expand the application of the bare Cu wires to smaller wire diameters. However, the bare Cu wires have a problem in that wear of capillary increases with decreases in wire diameter, resulting in a limited application range. The wear of capillary is defined herein as a phenomenon in which the inside of a capillary is worn due to friction in a contact interface between the bonding wire and inner part of the capillary. When wear of capillary occurs, defects such as distortion of loop shape or reduced bonding strength of ball bond areas or wire bond areas are caused. In particular, the neighborhood of a hole in a capillary tip has many opportunities to come into contact with bonding wires, and is thus liable to wear. Normally, the shape of the hole in the capillary tip before use is circular, but becomes elliptical with increases in the wear of capillary. Regarding methods for reducing the wear of capillary, methods for improving wear resistance of the capillary and methods for coating wire surfaces with a dissimilar metal have mainly been examined.

Patent Literature 1 discloses a technique related to a bonding capillary made of a first polycrystalline ceramic whose main phase is aluminum oxide crystals, and because the aluminum oxide crystals have an average particle diameter of 0.38 µm or less, the technique is capable of improving wear resistance and suitable when using a hard thin metal wire (bonding wire) made of copper or the like.

Patent Literature 2 relates to a bonding wire composed principally of Ag and discloses that by providing an Au-containing region containing 15 to 50 at. % of Au on an outermost surface of a coating layer, it is possible to reduce friction occurring in an interface between a bonding wire surface and a capillary and thereby improve the service life of the capillary. Patent Literature 3 discloses that as a result of forming an ultra-thin stretched layer of gold (Au) on an outermost surface of a wire in a precious metal-coated copper wire for ball bonding, a wire surface comes to slide more smoothly on a capillary.

However, even if these techniques are used, problems described later remain and required capillary wear performance cannot be satisfied.

CITATION LIST

Patent Literature

Patent Literature 1: Japanese Patent Laid-Open No. 2014-146622
Patent Literature 2: Japanese Patent Laid-Open No. 2016-115875
Patent Literature 3: Japanese Patent Laid-Open No. 2017-92078

SUMMARY OF INVENTION

Technical Problem

The above-mentioned wear of capillary occurs mainly in a loop formation process. In the loop formation process, a loop is formed between a ball bond area and wedge bond area with moving the capillary while feeding the bonding wire through the capillary. All this while, the inner side of the hole in the capillary tip remains in contact with the bonding wire, causing the neighborhood of the hole in the capillary tip to wear. When the wire diameter of the wire is small, stresses are readily concentrated on the contact interface between the bonding wire and capillary and the wear of capillary tends to increase.

To reduce the wear of capillary, it has been considered useful, for example, to improve the wear resistance of the capillary and to reduce frictional resistance in the contact interface between the capillary and bonding wire. However, even if the technique for improving the wear resistance of the capillary disclosed in Patent Literature 1 or the techniques for changing the structure of the outermost surface of the bonding wire disclosed in Patent Literatures 2 and 3 are used, it is difficult to reduce the wear of capillary when a bare Cu wire with a wire diameter of 30 µm or less is used. In this way, there has been demand for a technique for reducing wear of capillary when using a bare Cu wire with a small wire diameter.

Wedge bonding involves bonding a bonding wire to external electrodes via a capillary by applying ultrasound and a load to the bonding wire. Electrodes plated with Ag or Pd is commonly used as the external electrodes. The part of the bonding wire which is deformed by wedge bonding is referred to as a tail. Deformation behavior of the tail has an impact on bonding strength of wedge bond areas and stability of bonding, and thus it is important to control the deformation behavior. Conventional bare Cu wires have variations in the amount of tail deformation resulting from wedge bonding, and may fail to give proper bonding strength. When the amount of tail deformation is small, the bonding strength of wedge bond areas may be insufficient, causing defects in which bonding wires are separated from electrodes. When the amount of tail deformation is large, the bonding wire may be broken near a tail portion during wedge bonding, causing the bonding machine to stop. Thus, there has been demand for a technique for keeping the amount of tail deformation in a proper range to ensure sufficient bonding strength of wedge bond areas and carry out stable bonding when using a bare Cu wire.

A bent portion formed right above the ball as a result of loop formation after ball bonding is referred to as a neck portion. The neck portion, which is subject to larger bending deformation than other looped portions, has the problem of being partially damaged. The neck portion corresponds to a part affected by arc heat input (hereinafter referred to as a heat-affected zone) during ball formation. The heat-affected zone, which undergoes crystal grain coarsening as a result of arc heat input, is lower in strength than other loop portions and is liable to damage. Therefore, bare Cu wires require a technique for inhibiting strength reduction of the heat-affected zone and reducing damage to the neck portions.

Extended life of semiconductor devices demands longer service life. As a method for evaluating the longer service life of ball bond areas, a high temperature storage test, high temperature high humidity test, or thermal cycle test is conducted generally. The bare Cu wire had a problem in that in a high temperature high humidity test at a temperature of 130° C. and relative humidity of 85%, separation occurred in the neighborhood of ball bond areas in a relatively short time, resulting in reduction of bonding strength. Therefore, it was necessary to improve ball bond area life in high temperature high humidity test, and specifically, it was necessary to satisfy operating performance of 400 hours or more. When the bare Cu wire was ball-bonded to pure Al electrodes and the ball bond areas were molded with a commercially available sealing resin and a high temperature high humidity test was conducted under conditions of 130° C. in temperature and 85% in relative humidity, the bonding strength of the ball bond areas was reduced considerably in 300 hours. When a section of a ball bond area in which reduction of bonding strength was noted was polished and a bonding interface of the ball bond area was observed with a scanning electron microscope (SEM), it was found that plural intermetallic compounds composed principally of Al and Cu were formed in the bonding interface of the ball bond area and that separation occurred in the neighborhood. In this way, bare Cu wires require a technique for inhibiting separation of ball bond areas in high-temperature high-humidity environments and improving ball bond area life.

Along with performance improvements and functionality enhancement of electronic devices, high-density semiconductor packaging is under way. Because electrode pitch reductions are going on as a result of high-density packaging, high straightness of loops is required. On the one hand, the bonding wires used are being reduced in wire diameter, and consequently its strength tends to decline. In using thin bare Cu wires, there is a problem in that when a resin flows in during a plastic molding step after bonding, loop portions of the bonding wire bend, resulting in a loss of straightness. Therefore, bare Cu wires require a technique for inhibiting deformation of loop portions to maintain high straightness of loops even after plastic molding.

An object of the present invention is to provide a Cu alloy bonding wire for a semiconductor device, where the bonding wire can suppress wear of capillary.

Solution to Problem

In a Cu alloy bonding wire for a semiconductor device according to the present invention, the total of abundance ratios of crystal orientations <110> and <111> having an angular difference of 15 degrees or less from a direction perpendicular to one plane including a wire center axis to crystal orientations on a wire surface is 40% or more and 90% or less in average area percentage.

Advantageous Effects of Invention

In the Cu alloy bonding wire for a semiconductor device according to the present invention, since the total of abundance ratios of crystal orientations <110> and <111> having an angular difference of 15 degrees or less from the direction perpendicular to one plane including the wire center axis to crystal orientations on the wire surface is 40% or more and 90% or less, in average area percentage, wear of capillary can be reduced even when a bare Cu wire with a small wire diameter is used.

DESCRIPTION OF EMBODIMENTS

A bonding wire of the present embodiment is a Cu alloy bonding wire for a semiconductor device, wherein the total of abundance ratios of crystal orientations <110> and <111> having an angular difference of 15 degrees or less from a direction perpendicular to one plane including a wire center axis to crystal orientations on a wire surface is 40% or more and 90% or less in average area percentage.

(Method for Determining Crystal Orientation on Wire Surface)

A method disclosed in the present specification, i.e., a method for measuring a crystal orientation on a bonding wire surface will be described. In the present specification, the crystal orientation on a wire surface is defined to be the crystal orientation of an alloy part composed principally of Cu and Cu existing on the wire surface. The crystal orientation on the wire surface can be measured on a Scanning Electron Microscope (SEM) using an electron backscattered diffraction (EBSD) method. The EBSD method involves directing an electron beam at a sample, projecting a diffraction pattern of reflected electrons thus generated at a detector surface, analyzing the diffraction pattern, and thereby determining the crystal orientations at individual measurement points. Dedicated software (OIM analysis produced by TSL Solutions and the like) is suitable for analyzing data obtained by the EBSD method. According to the present embodiment, a bonding wire is fixed to a sample stage, an electron beam is directed at the wire surface from one direction, and data on crystal orientations is obtained. Using this method, of the crystal orientations on the wire surface, a crystal orientation from the direction perpendicular to one plane including the wire center axis and a crystal orientation relative to the direction of the wire center axis can be determined. Using the crystal orientation data determined by the above method, the abundance ratio of a specific crystal orientation is calculated.

As an example, description will be given of a method for calculating the total of abundance ratios of crystal orientations <110> and <111> from the direction perpendicular to one plane including the wire center axis to the crystal orientations on the bonding wire surface. The total of abundance ratios of crystal orientations <110> and <111> is a total value of a ratio of the area occupied by the crystal orientation <110> and a crystal orientation <111> determined by the above method to the area of a measurement region for EBSD.

Figure 1:
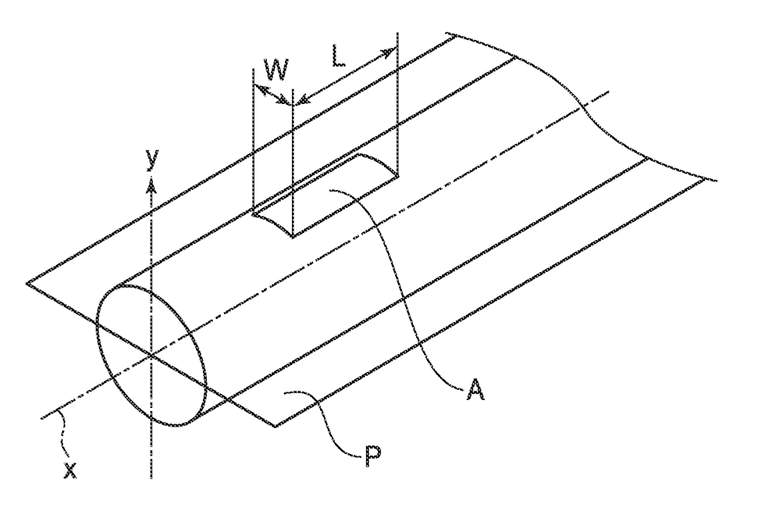
FIG. 1 is a perspective view explaining a measurement region.

As shown in FIG. 1, the crystal orientation <110> and the crystal orientation <111> are defined herein to be a crystal orientation having an angle of 15 degrees or less from a direction Y perpendicular to one plane P including a wire center axis X out of crystal orientations <110> and crystal orientation <111> respectively on the wire surface. This is because effects for improvement of bonding wire characteristics can be obtained if the angle is 15 degrees or less. Abundance ratios of crystal orientation <100> having an angle of 15 degrees or less with respect to the direction of the wire center axis X to the crystal orientations on the bonding wire surface can be calculated using a similar method.

Average area percentage is used herein as a value of the abundance ratio of a specific crystal orientation. The average area percentage is an arithmetic mean of values of abundance ratios obtained by measuring at least ten or more points by EBSD. In selecting the measurement points, preferably the objectivity of measurement data is ensured. As a method therefor, preferably measurement samples are taken from the bonding wire to be measured, at intervals of 3 to 5 m along the direction of the wire center axis X of the bonding wire and used for measurement. On an SEM image, preferably a measurement region A has a length W of 25% or less the wire diameter in a circumference direction and a length L of 40 μm to 100 μm in the direction of the wire center axis X.

It was confirmed that the crystal orientations and their area percentages measured by EBSD using the above method had a strong correlation with a reduction effect on the wear of capillary, where the reduction effect is a working effect of the present invention. The wire surface is a curved surface, and deviates from the orientation perpendicular to the wire surface with increasing distance in a circumferential direction from a peak (the highest point of the wire fixed to the sample stage from the circumferential direction) of the wire, but it can be said that the measurement data taken by the above method is consistent with the actual conditions indicating the reduction effect on the wear of capillary. This is because when the length W of the measurement region A is at least 25% or less the wire diameter, in the EBSD measurement region of the wire surface having a curved surface, the deviation of the orientation perpendicular to the wire surface from the circumferential direction is permissible and the reduction effect on the wear of capillary can be obtained. The reason why a lower limit is placed on the measurement region A in the direction of the wire center axis X is that it was judged that measurement data reflected characteristics of the sample sufficiently if the length L was 40 μm or more. The reason why an upper limit is placed on the measurement region A in the direction of the wire center axis X is that analysis can be conducted efficiently if the length L is 100 μm or less.

There may be a copper oxide film and/or impurities on the surface of the bonding wire. Examples of the impurities include organic matter, sulfur, nitrogen, and compounds thereof. Even if such impurities exist, if the thickness of impurities is small or the abundance thereof is low, by optimizing measurement conditions of the EBSD method, the crystal orientations on the bonding wire surface can be measured. If there is a thick copper oxide film or a large deposit of impurities on the bonding wire surface, it may be impossible to measure crystal orientations in Cu or in a Cu alloy part. In that case, it is useful to treat the bonding wire surface by alkaline degreasing, acid washing, ion sputtering, or the like before EBSD measurements are taken.

(Reduction Effect on Wear of Capillary)

The inventors investigated the cause of wear of capillary in using bare Cu wires and noted a correlation with the crystal orientation on the wire surface. That is, the wear of capillary has a correlation with the total of abundance ratios of crystal orientations <110> and <111> having an angular difference of 15 degrees or less from the direction perpendicular to one plane including the wire center axis to the crystal orientations on the wire surface, and a capillary wear reduction effect is obtained by keeping the total of the abundance ratios of the crystal orientations <110> and <111> in a proper range.

Specifically, if the total of abundance ratios of crystal orientations <110> and <111> having an angular difference of 15 degrees or less from the direction perpendicular to one plane including the wire center axis to the crystal orientations on the wire surface is 40% or more and 90% or less, in average area percentage, a capillary wear reduction effect is obtained. After actually forming 3000 bonds using the bonding wire of the present embodiment, the hole in the capillary tip was observed under an optical microscope, and it was confirmed that the hole in the capillary maintained a circular shape without wear. Furthermore, when the tip of the capillary was observed in detail under an SEM, the capillary tip was almost free of Cu alloy, which was the wire material. From this, it is considered that the reason why the bonding wire of the present embodiment exhibited the capillary wear reduction effect was that the friction occurring between the wire surface and capillary was reduced due to the increase in the total of abundance ratios of crystal orientations <110> and <111> to the crystal orientations on the wire surface, the crystal orientations <110> and <111> having an angular difference of 15 degrees or less from the direction perpendicular to one plane including the wire center axis.

When the total of the abundance ratios was less than 40% in average area percentage, the above effect was insufficient and a capillary wear reduction effect was not observed. When the total of the abundance ratios exceeded 90% in average area percentage, it was found that the bonding wire was not suitable for practical use because of an increased occurrence rate of deformed balls in a ball formation step. A conceivable cause of this is that in forming balls by melting the tip of the bonding wire by arc discharge, the arc spreads out, making a spot at which the bonding wire started to melt unstable.

preferably the total of abundance ratios of crystal orientations <110> and <111> having an angular difference of 15 degrees or less from the direction perpendicular to one plane including the wire center axis to the crystal orientations on the wire surface is 50% or more and 85% or less, in average area percentage, because an excellent capillary wear reduction effect is obtained.

(Reduction Effect on Tail Shape Variation of Wedge Bond Areas)

Furthermore, in the bonding wire of the present embodiment, desirably the abundance ratio of the crystal orientation <100> having an angular difference of 15 degrees or less from the direction of the wire center axis to the crystal orientations on the wire surface is 30% or more and 100% or less, in average area percentage. The inventors investigated factors that affected the tail shape of wedge bond areas, and found that the crystal orientation on the wire surface had a correlation with the tail shape of wedge bond areas and that increases in the abundance ratio of the crystal orientation <100> had the effect of reducing variation in the tail shape of wedge bond areas. It is considered that this is because two effects acted synergistically: the effect of reducing variation in deformation resistance in the direction of the wire center axis by increasing the abundance ratio of the crystal orientation <100>, and the effect of reducing the wear of capillary by controlling the abundance ratios of crystal orientations <110> and <111> to the crystal orientations on the wire surface, the crystal orientations <110> and <111> having an angular difference of 15 degrees or less from the direction perpendicular to one plane including the wire center axis. When the abundance ratio of the crystal orientation <100> is less than 30%, the effect of reducing the variation in the deformation resistance in the direction of the wire center axis is insufficient, and thus the effect of reducing the variation in the tail shape is insufficient.

(Reduction of Wire Damage in Neck Portions)

Furthermore, in the bonding wire of the present embodiment, desirably the total of abundance ratios of the crystal orientations <111> and <100> having an angular difference of 15 degrees or less from the direction of the wire center axis to crystal orientations in a section in a direction parallel to the direction of the wire center axis is 25% or more and 100% or less, in average area percentage. The inventors investigated factors that affected wire damage in neck portions and found that wire damage in neck portions had a correlation with the crystal orientation in a section in a direction parallel to the direction of the wire center axis, and that increases in the total of abundance ratios of the crystal orientations <111> and <100> had the effect of reducing wire damage in neck portions. It is considered that this is because two effects acted synergistically: the effect of increasing deformation resistance of a heat-affected zone to bending deformation in forming neck portions by increasing the total of abundance ratios of the crystal orientations <111> and <100>, and the effect of reducing the wear of capillary by controlling the abundance ratios of crystal orientations <110> and <111> to the crystal orientations on the wire surface, the crystal orientations <110> and <111> having an angular difference of 15 degrees or less from the direction perpendicular to one plane including the wire center axis. When the total of abundance ratios of the crystal orientations <111> and <100> is less than 25% in average area percentage, the effect of increasing deformation resistance to bending deformation in forming neck portions is insufficient, and thus the effect of reducing wire damage in neck portions is insufficient.

(Improvement Effect on Ball Bond Area Life in High Temperature High Humidity Test)

Desirably the bonding wire of the present embodiment further contains one or more of Ni, Pd, Pt, and Au for a total of 0.01 mass % or more and 1.5 mass % or less, and the balance being Cu and incidental impurities. The inventors investigated factors that affected ball bond area life in a high temperature high humidity test at a temperature of 130° C. and relative humidity of 85% and found that the ball bond are life depended on the types and concentrations of alloying elements contained in the bonding wire, and that the effect of improving ball bond area life in high temperature high humidity test was obtained when the bonding wire contained one or more of Ni, Pd, Pt, and Au for a total of 0.01 mass % or more and 1.5 mass % or less. When a section of a ball bond area was exposed by polishing and observed under a scanning electron microscope, the growth of intermetallic compounds had been inhibited. From this, it is considered that containing one or more of Ni, Pd, Pt, and Au in proper concentrations inhibited the growth of intermetallic compounds formed in a bonding interface of the ball bond area, thereby improving the ball bond area life in high temperature high humidity test. When the concentration of one or more of Ni, Pd, Pt, and Au contained in the bonding wire is less than 0.01 mass % in total, the effect of inhibiting the growth of intermetallic compounds is insufficient, and thus the effect of improving the ball bond area life in high temperature high humidity test is insufficient. When one or more of Ni, Pd, Pt, and Au are contained more than 1.5 mass % in total, the hardness of balls increases, making the growth of intermetallic compounds nonuniform, and thus the ball bond are life improvement effect in high temperature high humidity test is insufficient.

Preferably the bonding wire of the present embodiment contains Pt or Pd, because the effect of inhibiting the growth of intermetallic compounds formed in an interface between wires and electrode in ball bond areas is particularly high and an excellent ball bond area life improvement effect in high temperature high humidity test is obtained.

(Further Reduction Effect on Wear of Capillary)

By further containing one or more of P, In, Ga, Ge, and Ag for a total of 0.001 mass % or more and 0.75 mass % or less, the bonding wire of the present embodiment offers the effect of further reducing the wear of capillary. It is considered that this is because two effects acted synergistically: the effect of reducing the wear of capillary by keeping the total of abundance ratios of crystal orientations <110> and <111> to the crystal orientations on the wire surface within 40% or more and 90% or less, the crystal orientations <110> and <111> having an angular difference of 15 degrees or less from the direction perpendicular to one plane including the wire center axis, and the effect of reducing the frictional resistance in the contact interface between the wire and capillary by that part of the above-mentioned elements causes monotectoid reaction on the wire surface.

(Further Reduction Effect on Tail Shape Variation of Wedge Bond Areas)

By further containing one or more of P, In, Ga, Ge, and Ag for a total of 0.001 mass % or more and 0.75 mass % or less, the bonding wire of the present embodiment offers the effect of further reducing the variation in the tail shape of wedge bond areas. It is considered that this is because two effects acted synergistically: the effect of reducing the variation in the deformation resistance in the direction of the wire center axis by keeping the crystal orientation <100> to the crystal orientations on the wire surface within 30% or more and 100% or less, in average area percentage, the crystal orientation <100> having an angular difference of 15 degrees or less from the direction of the wire center axis, and the effect of reducing the variation in the amount of wire deformation by that part of the above-mentioned elements increases the strength of the bonding wire.

(Improvement Effect on Straightness of Loops)

By further containing one or more of P, In, Ga, Ge, and Ag for a total of 0.001 mass % or more and 0.75 mass % or less, the bonding wire of the present embodiment offers the effect of improving the straightness of loops after the bonding wire is bonded and plastic molding is done. It is considered that this is because two effects acted synergistically: the effect of increasing the deformation resistance to a resin flow during plastic molding by containing one or more of the above-mentioned elements 0.001 mass % or more in total, and the effect of reducing the wear of capillary and thereby feeding the bonding wire stably through the capillary by controlling the abundance ratios of crystal orientations <110> and <111> to the crystal orientations on the wire surface, the crystal orientations <110> and <111> having an angular difference of 15 degrees or less from the direction perpendicular to one plane including the wire center axis. When the concentration of one or more of P, In, Ga, Ge, and Ag contained in the bonding wire is less than 0.001 mass % in total, the effect of improving the straightness of loops after plastic molding is insufficient. When one or more of P, In, Ga, Ge, and Ag are contained more than 0.75 mass % in total, the wire strength increases too much, making it difficult to form a desired loop shape, and thus the improvement effect on straightness of loops is insufficient.

Preferably the bonding wire of the present embodiment contains Ag because an excellent improvement effect on straightness of loops is obtained.

(Method for Producing Bonding Wire)

A production method of a bonding wire for a semiconductor device of the present embodiment will be described.

(Melting Method)

First, using high-purity Cu with copper purity of 4N to 6N (Cu concentration: 99.99 mass % or more and 99.9999 mass % or less), a copper alloy containing necessary concentrations of additive elements is prepared by melting. An arc melting furnace, high-frequency melting furnace, or the like can be used for the melting. To prevent admixture of atmospheric gases such as $O_2$ and $H_2$, preferably the melting is done in a vacuum atmosphere or in an inert atmosphere of Ar, $N_2$, or another gas. After the melting, the copper is cooled slowly in the furnace to prepare an ingot. Preferably, surfaces of the ingot produced by melting are washed with acid or alcohol, followed by subsequent drying.

(Alloying)

Available methods for alloying copper with alloying elements include a method of directly melting and alloying copper and high-purity additive elements and a method of preparing a master alloy made up of copper and approximately 3 to 5 mass % additive elements in advance and melting and alloying copper with the master alloy. The technique that uses a master alloy is effective in making an element distribution uniform at a low concentration. An ICP optical emission spectrometer or the like can be used for concentration analysis of elements contained in the bonding wire. If elements such as oxygen, carbon, and/or sulfur are adsorbed to the surface of the bonding wire, before conducting concentration analysis, concentration analysis may be taken after shaving a region of 1 to 2 nm off the surface of the bonding wire by sputtering or the like. Other effective methods include a method which uses acid washing.

(Description of Drawing Process and Heat Treatment)

Preferably the copper alloy ingot thus produced is processed first into a thick diameter by rolling and forging and then reduced in diameter by a drawing process until a final wire diameter is reached. A continuous wire drawing machine capable of being equipped with plural diamond-coated dies can be used for the drawing process. Preferably a lubricant is used during continuous wire drawing to reduce worn-out of the dies and wire surface flaws. At an intermediate wire diameter in a preceding stage before a final wire diameter is reached, preferably intermediate heat treatment is carried out at an intermediate stage of the drawing process for the principal purpose of removing strain. With the final wire diameter, final heat treatment is carried out to adjust breaking elongation by recrystallizing the bonding wire. It is useful to carry out the intermediate heat treatment and final heat treatment while continuously running the wire. Note that preferably the heat treatment is carried out by refluxing Ar gas or $N_2$ gas to inhibit oxidation of the bonding wire surface during the heat treatment as much as possible. In order to further prevent oxidation, it is also useful to contain a few percent $H_2$.

(Method for Controlling Crystal Orientation on Wire Surface)

To control the crystal orientations on the wire surface, it is useful to control conditions for a wire drawing process or conditions for final heat treatment. A representative control method is shown below. Description will be given below of an example in which, the total of abundance ratios of crystal orientations <110> and <111> having an angular difference of 15 degrees or less from the direction perpendicular to one plane including the wire center axis to the crystal orientations on the wire surface is kept 40% or more and 90% or less in average area percentage. When a drawing process is performed, the abundance ratio of the crystal orientation <110> from the direction perpendicular to one plane including the wire center axis to the crystal orientations on the wire surface tends to increase. On the other hand, when heat treatment is carried out after the drawing process, recrystallization occurs, and consequently the crystal orientation <110> tends to decrease and the crystal orientation <111> tends to increase. To control the crystal orientations on the wire surface, it is useful to control the abundance ratios of the crystal orientations <110> and <111> by recrystallizing the bonding wire by final heat treatment after the crystal orientation <110> is developed by the drawing process.

First, proper conditions for the drawing process will be described. In the drawing process, to increase the abundance ratios of the crystal orientations <110> and <111> having an angular difference of 15 degrees or less from the direction perpendicular to one plane including the wire center axis to the crystal orientations on the wire surface, it is useful to increase a processing rate of the drawing process. The processing rate in the drawing process is defined by the following expression.

$$P=\{(R_1^2-R_2^2)/R_1^2\}\times 100$$

P: Processing rate of drawing process
$R_1$: Wire diameter (mm) before drawing process
$R_2$: Wire diameter (mm) of the final product To produce the bonding wire of the present embodiment, it is useful to keep the processing rate of the drawing process 92% or more and less than 100%. This is because if the processing rate of the drawing process is 92% or more, the abundance ratios of crystal orientations <110> and <111> immediately after the drawing process can be increased. Also, if final heat treatment is carried out subsequently in a proper temperature range, the crystal orientation <111> can be further increased and the total of the abundance ratios of the crystal orientations <110> and <111> can eventually be kept at 40% or more. If intermediate heat treatment is carried out before a wire diameter of the final product is reached, the wire diameter after the intermediate heat treatment can be used as the wire diameter ($R_1$) before the drawing process.

Next, proper conditions for the final heat treatment will be described. The final heat treatment conditions that affect the total value of abundance ratios of the crystal orientations <110> and <111> are mainly heat treatment temperature, heat treatment time, and cooling process.

It is useful to set the final heat treatment temperature and final heat treatment time at 350° C. or more and 670° C. or less and 0.05 seconds or more and 1.6 seconds or less respectively. As long as the heat treatment temperature and heat treatment time are in the above ranges, the crystal orientation <111> can be increased by recrystallization while the crystal orientation <110> increased by the drawing process is kept as it is. The reason why the lower limit of the final heat treatment temperature is 350° C. and the lower limit of the heat treatment time is 0.05 seconds is that although recrystallization occurs under conditions less than these lower limits, the mechanical properties such as strength or elongation properties required of the bonding wire cannot be obtained sufficiently. The reason why the upper limit of the final heat treatment temperature is 670° C. and the upper limit of the final heat treatment time is 1.6 seconds is that under conditions exceeding these upper limits, the crystal orientations other than the crystal orientations <110> and <111> develop, thereby causing the total of abundance ratios of the crystal orientations <110> and <111> to become less than 40%.

A cooling process after the final heat treatment will be described. After the final heat treatment, it is useful that the wire is left in a temperature range of 300° C. or more and less than 350° C. for 0.03 seconds or more and less than 1.0 second and then cooled to room temperature. This is because by keeping the wire in the above-mentioned temperature range during cooling, it is possible to preferentially grow crystal grains having the crystal orientation <111> while keeping the crystal orientation <110> as it is. When the temperature of the cooling process is less than 300° C. and the holding time is less than 0.03 seconds, the effect of preferentially growing crystal grains having the crystal orientation <111> while keeping the crystal orientation <110> as it is cannot be obtained. When the temperature of the cooling process becomes 350° C. or more and the holding time becomes 1.0 second or more, recrystallization and the like occur, reducing the crystal orientation <110>, and consequently it is likely that the total of the abundance ratios of the crystal orientations <110> and <111> will become 40% or less. In the cooling process, for example, assuming a structure for continuously running the wire, it is useful that the wire is heat-treated and then passed through a site in which an inert gas is circulated. As a result of this final heat treatment, the total of the abundance ratios of the crystal orientations <110> and <111> can be kept in the range of 40% or more and 90% or less.

(Method for Controlling Crystal Orientations with Respect to Direction of Wire Center Axis on Wire Surface)

Description will be given below of a method for keeping the abundance ratios of crystal orientation <100> having an angular difference of 15 degrees or less from the direction of the wire center axis to the crystal orientations on the wire surface 30% or more and 100% or less in average area percentage. To control the crystal orientation <100>, it is useful to control a wire feed rate during the drawing process and a processing rate for the drawing process. By varying the wire feed rate, it is possible to control a frictional force generated on an interface between the die and wire and contributory to development of the crystal orientation in the direction of the wire center axis on the wire surface. The crystal orientation <100> tends to increase with increases in the processing rate of the drawing process. To control the crystal orientation <100>, it is useful to keep the wire feed rate 500 m/min or more and 700 m/min or less. It is useful that the processing rate of the drawing process is 95% or more. If the above conditions are satisfied, the crystal orientation <100> can be kept 30% or more and 100% or less in average area percentage. If the wire feed rate is less than 500 m/min and the lower limit of the processing rate of the drawing process is less than 95%, the abundance ratios of crystal orientation <100> will become less than 30% in average area percentage. When the wire feed rate exceeds 700 m/min, die wear increases, posing a problem of reduced productivity.

(Method for Controlling Crystal Orientations in Section in Direction Parallel to Wire Center Axis)

Description will be given of a typical control method for keeping the total of abundance ratios of the crystal orientations <111> and <100> to the crystal orientations in a section in the direction parallel to the direction of the wire center axis within a range of 25% or more and 100% or less, in average area percentage, the crystal orientations <111> and <100> having an angular difference of 15 degrees or less from the direction of the wire center axis. In order to control the crystal orientations <111> and <100>, it is useful to control the reduction of area per die used for the drawing process. Specifically, it is useful that the processing rate per die is 18% or more. Here, the processing rate per die is the ratio of the wire's cross-sectional area reduced by the drawing process to the wire's cross-sectional area before the drawing process. This is because when the processing rate per die is 18% or more, rotation and slip deformation of crystals occur as a result of the drawing process not only on the wire surface, but also inside the wire.

EXAMPLES (Method for Producing Bonding Wire)

A method for producing a bonding wire will be described. The Cu used as a raw material had a purity of 99.99 mass % or more, and the balance being incidental impurities. When the bonding wire contained Ni, Pd, Pt, Au, P, In, Ga, Ge, and Ag as additive elements, Cu and these elements were melted in a high-frequency melting furnace and alloyed together. When a target total concentration of the additive elements except the incidental impurities was less than 0.5 mass %, an alloy of the intended concentration was prepared using a Cu alloy containing high concentrations of the additive elements.

An Ar atmosphere was used during melting to minimize admixture of impurities such as oxygen. The ingot produced by melting had a columnar shape with a diameter of a few mm. The surface of the resulting ingot was acid-washed using sulfuric acid, hydrochloric acid, or the like to remove an oxide film from the ingot. Subsequently, the ingot was subjected to a drawing process and forging process to produce a wire with a diameter in a range of 0.3 to 0.5 mm. Subsequently, intermediate heat treatment was carried out, and then, the wire was further processed by a drawing process to a diameter of 20 μm. The wire feed rate during the drawing process was 500 m/min or more and 700 m/min or less. A commercially available lubricant was used. In so doing, the processing rate per die was 19% or more and 25% or less. The processing rate of the drawing process was 92% or more and 99.5% or less. The intermediate heat treatment and final heat treatment were carried out at a temperature of 350° C. or more and 670° C. or less, while continuously running the wire at a feed rate of 20 to 700 m/min. The heat treatment was carried out in a $N_2$ or Ar atmosphere to prevent oxidation. The configuration of the produced bonding wire is shown in Table 1.

(Evaluation Method)

The concentrations of the additive elements contained in the bonding wire of the present embodiment were analyzed using an ICP optical emission spectrometer. The wire diameter of the bonding wire used for the present evaluation was 20 μm.

The total value of abundance ratios of crystal orientations <110> and <111> having an angular difference of 15 degrees or less from the direction perpendicular to one plane including the wire center axis to the crystal orientations on the wire surface of the bonding wire of the present embodiment was calculated from data measured by the EBSD method. The abundance ratio was the arithmetic average of measured values taken at 10 locations of the wire at intervals of 3 m. The measurement region described above was a region on a screen on which EBSD measurements were taken, i.e., a region surrounded by a straight line with a length of 5 μm (25% the wire diameter) in the circumferential direction and a straight line with a length of 40 μm in the direction of the wire center axis. Furthermore, the measurement region included the highest point of the wire sample fixed to the sample stage, with respect to the circumferential direction.

The abundance ratios of crystal orientation <100> having an angular difference of 15 degrees or less from the direction of the wire center axis to the crystal orientations on the wire surface of the bonding wire of the present embodiment were calculated from data measured by the EBSD method. The abundance ratios were the average values of values taken at 10 locations of the wire at intervals of 3 m. The measurement region was a region on a screen on which EBSD measurements were taken, i.e., a region surrounded by a straight line with a length of 5 μm (25% the wire diameter) in the circumferential direction and a straight line with a length of 40 μm in the direction of the wire center axis. Furthermore, the measurement region included the highest point of the wire sample fixed to the sample stage, with respect to the circumferential direction.

In a section in the direction parallel to the direction of the wire center axis according to the present embodiment the total of abundance ratios of the crystal orientations <111> and <100> having an angular difference of 15 degrees or less from the direction of the center axis of the bonding wire was measured by EBSD after the wire section was polished and exposed by an Ar ion beam. The total of abundance ratios of the crystal orientations <111> and <100> having an angular difference of 15 degrees or less from the direction of the wire center axis was the arithmetic average of values taken at 10 locations of the wire at intervals of 3 m. The measurement region was 80 μm in the direction of the wire center axis and 20 μm in the diametrical direction. In doing so, the diametrical direction was set such that the both ends of the wire were included entirely.

(Evaluation Method for Wear of Capillary)

The wear of capillary was evaluated based on the number of trials carried out to bond the bonding wire until wear of capillary occurred. A general-purpose capillary and bonding machine were used. To check the capillary for wear, the hole in the tip of the capillary was observed under an optical microscope, and if roundness was maintained, it was judged that there was no problem, but if roundness had been impaired, it was judged that the capillary was worn. The above-mentioned observation of the capillary was carried out every 500 trials for bonding. When wear of capillary occurred when the number of trials for bonding reached less than 3000, 0 points were given by judging that there was a problem in practical use. When wear of capillary occurred when the number of trials for bonding reached 3000 or more and less than 5000, 1 point was given by judging that there was no problem in practical use. When wear of capillary occurred when the number of trials for bonding reached 5000 or more and less than 7000, 2 points were given by judging that the result was good. When wear of capillary did not occur even when the number of trials for bonding reached 7000 or more, 3 points were given by judging that the result was excellent. Evaluation results are shown in the "Wear of capillary" fields of Table 2. Only the 0 points were rejected, and the other points were accepted.

(Evaluation Method for Tail Shape Variation of Wedge Bond Areas)

The variation in the tail shape of wedge bond areas can be evaluated by continuous bondability evaluation of wedge bond areas. This is because if there is large tail shape variation, the bonding wire will separate from wedge bond areas or the bonding wire will be broken in the neighborhood of wedge bond areas due to insufficient bonding strength, causing the bonding machine to stop. To evaluate continuous bondability of wedge bonding, window evaluation was used. The window evaluation is a technique for judging continuous bondability by varying parameters of the ultrasound and load during wedge bonding, where the judgment is made based on the range of bonding conditions in which bonding can be carried out a certain number of times successively. A general-purpose capillary was used. The bonding machine used was IConn made by Kulicke & Soffa Industries, Inc. The electrodes to which the bonding wire was bonded were prepared by Ag-plating a lead frame. The stage temperature during bonding was 175° C. Each of the ultrasound oscillation output parameter and load parameter was varied at intervals of 10 in a range of 20 to 80 and bonding was tried under a total of 49 conditions. Of the 49 conditions, when there were less than 40 conditions under which 200 or more wires were able to be bonded successively, 0 points were given by judging that there was a problem in practical use. When there were 40 or more and less than 43 such conditions, 1 point was given by judging that there was no problem in practical use. When there were 43 or more and less than 45 such conditions, 2 points were given by judging that the result was good. When there were 45 or more such conditions, 3 points were given by judging that the result was excellent. Evaluation results are shown in the "Window evaluation of wedge bonding" field of Table 2. The 0 points were rejected, and the other points were accepted.

(Evaluation Method for Wire Damage in Neck Portions)

To evaluate wire damage in neck portions, neck areas were observed and checked for damage after bonding using a general-purpose bonding machine. The loop length was 2.5 mm, the loop height was 0.2 mm, and the loop shape was trapezoidal. Neck areas of 200 bonded wires were observed under an electron microscope. When there were two or more damaged neck areas, 0 points were given by judging that the bonding was defective. When there was one damaged neck area, 1 point was given by judging that there was no problem in practical use; and when there was no defective neck area, 2 points were given by judging that the result was excellent.

Evaluation results are shown in the "Wire damage in neck portions" fields of Table 2. The 0 points were rejected, and the other points were accepted.

(Evaluation Method for Ball Bond Area Life in High Temperature High Humidity Test)

Samples for high temperature high humidity test were manufactured as follows: electrodes were prepared by forming an Al film having a thickness of 1.0 µm on a Si substrate on a typical metal frame, ball-bonded using a general-purpose bonding machine, and sealed by a commercially available epoxy resin. The balls were formed by running $N_2$+5 vol. % $H_2$ gas at a flow rate of 0.4 to 0.6 L/min and the ball diameter was in a range of 1.5 to 1.6 times the wire diameter. The test temperature was 130° C., and the relative humidity was 85% in high temperature high humidity test. The time required for the bonding strength of the ball bond areas to fall to 50% or less the bonding strength before the start of test was used as the life of ball bond areas in the high temperature high humidity test. In the present evaluation, the bonding strength of the ball bond areas was measured every 100 hours. Values measured by a micro area bond tester made by DAGE Co., Ltd. was used as the bonding strength of the ball bond areas. After the high temperature high humidity test, the ball bond areas were exposed by removing resin by acid treatment before conducting a shear test. The average value of measured values of ten ball bond areas selected at random was used as the value of shear strength. In the above evaluation, when the life of the ball bond area was less than 400 hours, 0 points were given by judging that there was a problem in practical use; when the life of the ball bond area was 400 hours or more and less than 600 hours, 1 point was given by judging that there was no problem in practical use; when the life of the ball bond area was 600 hours or more, 2 point were given by judging that the result was excellent; and when the life of the ball bond area was 1000 hours or more, 3 points were given by judging that the result was particularly excellent. Evaluation results are shown in the "Ball bond area life in high temperature high humidity test" fields of Table 2. Only the 0 points were rejected, and the other points were accepted.

(Evaluation Method for Straightness of Loops)

To evaluate the straightness of loops, after bonding using a general-purpose bonding machine, the bonds were sealed by a resin, loop portions were observed, and it was checked whether the loops were bent. The loop length was 2.5 mm and the loop height was 0.2 mm. The loop portions of 200 bonded wires were observed using a soft X-ray apparatus, and when the position farthest from a straight line connecting the ball bond area and wire bond area was 20 µm or more, the loop portion was judged to be defective. When there were 3 or more defective loops, 0 points were given by judging that the bonding was defective. When there were 2 defective loops, 1 point was given by judging that there was no problem in practical use; when there were 1 defective loop, 1 point was given by judging that the result was excellent; and when there was no defective loop, 2 point was given by judging that the result was particularly excellent. Evaluation results are shown in the "Straightness of loops" fields of Table 2. The 0 points were rejected, and the other points were accepted.

(Description of Evaluation Results)

Examples Nos. 1 to 72 were alloy bonding wires for a semiconductor device, where the total of abundance ratios of crystal orientations <110> and <111> having an angular difference of 15 degrees or less from the direction perpendicular to one plane including the wire center axis to the crystal orientations on the wire surface was 40% or more and 90% or less in average area percentage. Thus, all the alloy bonding wires had no problem in practical use in terms of wear of capillary. Examples Nos. 3 to 72 produced good evaluation results in terms of wear of capillary because the total of abundance ratios of crystal orientations <110> and <111> was 50% or more and 85% or less, in average area percentage.

Examples Nos. 5 to 72 were Cu alloy bonding wires for a semiconductor device, where the abundance ratio of the crystal orientation <100> having an angular difference of 15 degrees or less from the direction perpendicular to one plane including the wire center axis to the crystal orientations on the wire surface was 30% or more and 100% or less in average area percentage. Thus, good evaluation results were obtained in every case in terms of window evaluation of wedge bonding.

Examples Nos. 7 to 72 produced excellent evaluation results in terms of wire damage in neck portions because the Cu alloy bonding wire for a semiconductor device was used and the total of abundance ratios of crystal orientations <111> and <100> to the crystal orientations in a section in the direction parallel to the direction of the wire center axis was 25% or more and 100% or less, in average area percentage, the crystal orientations <111> and <100> having an angular difference of 15 degrees or less from the direction of the wire center axis.

Examples Nos. 9 to 22, which contained one or more of Ni, Pd, Pt, and Au for a total of 0.01 mass % or more and 1.5 mass % or less, produced excellent evaluation results in terms of ball bond area life in high temperature high humidity test. Examples Nos. 10, 11, 13, 14, 16, 17, and 19 to 22, which contained Pd and Pt, produced a particularly excellent evaluation result.

Examples Nos. 59 to 72, which contained one or more of P, In, Ga, Ge, and Ag for a total of 0.001 mass % or more and 0.75 mass % or less, produced excellent evaluation results in terms of straightness of loops, wear of capillary, and wire damage in neck portions. Examples Nos. 63, 68 to 72, which contained Ag, showed excellent effects in terms of straightness of loops.

Examples Nos. 23 to 58, which contained one or more of Ni, Pd, Pt, and Au for a total of 0.01 mass % or more and 1.5 mass % or less, and further contained one or more of P, In, Ga, Ge, and Ag for a total of 0.001 mass % or more and 0.75 mass % or less, produced excellent evaluation results in terms of ball bond area life in high temperature high humidity test, wear of capillary, variation in the tail shape of wedge bond areas, and straightness of loops. Examples Nos. 27, 32 to 40, 45, 50 to 58, which contained Ag, showed excellent effects in terms of straightness of loops. Examples Nos. 23 to 58, which contained Pd and Pt, produced a particularly excellent evaluation result on ball bond area life in high temperature high humidity test.

TABLE 1

| | | No. | Wire diameter (μm) | Direction perpendicular to plane including wire center axis — Abundance ratios (%) of crystal orientations | | Direction of wire center axis — Abundance ratio of crystal orientation | Direction of wire center axis — Abundance ratios (%) of crystal orientations | | Additive elements | | | | | | Additive elements | | | | |
|---|---|---|---|---|---|---|---|---|---|---|---|---|---|---|---|---|---|---|---|---|
| | | | | <110> and <111> | <111> | <100> | <111> and <100> | <100> | Ni | Pd | Pt | Au | Total | P | In | Ga | Ge | Ag | Total |
| Examples | | 1 | 20 | 40 | | 13 | 20 | | — | — | — | — | 0 | — | — | — | — | — | 0 |
| | | 2 | 20 | 90 | | 11 | 21 | | — | — | — | — | 0 | — | — | — | — | — | 0 |
| | | 3 | 20 | 50 | | 22 | 20 | | — | — | — | — | 0 | — | — | — | — | — | 0 |
| | | 4 | 20 | 85 | | 22 | 21 | | — | — | — | — | 0 | — | — | — | — | — | 0 |
| | | 5 | 20 | 51 | | 30 | 20 | | — | — | — | — | 0 | — | — | — | — | — | 0 |
| | | 6 | 20 | 55 | | 100 | 23 | | — | — | — | — | 0 | — | — | — | — | — | 0 |
| | | 7 | 20 | 58 | | 35 | 25 | | — | — | — | — | 0 | — | — | — | — | — | 0 |
| | | 8 | 20 | 56 | | 54 | 100 | | — | — | — | — | 0 | — | — | — | — | — | 0 |
| | | 9 | 20 | 64 | | 65 | 45 | | 0.01 | — | — | — | 0.01 | — | — | — | — | — | 0 |
| | | 10 | 20 | 67 | | 60 | 42 | | — | 0.01 | — | — | 0.01 | — | — | — | — | — | 0 |
| | | 11 | 20 | 64 | | 65 | 40 | | — | — | 0.01 | — | 0.01 | — | — | — | — | — | 0 |
| | | 12 | 20 | 65 | | 64 | 44 | | — | — | — | 0.0 | 0.01 | — | — | — | — | — | 0 |
| | | 13 | 20 | 77 | | 35 | 48 | | — | 0.26 | — | — | 0.26 | — | — | — | — | — | 0 |
| | | 14 | 20 | 74 | | 48 | 44 | | — | — | 0.5 | — | 0.50 | — | — | — | — | — | 0 |
| | | 15 | 20 | 80 | | 84 | 67 | | 1.50 | — | — | — | 1.50 | — | — | — | — | — | 0 |
| | | 16 | 20 | 74 | | 75 | 44 | | — | 1.50 | — | — | 1.50 | — | — | — | — | — | 0 |
| | | 17 | 20 | 68 | | 61 | 28 | | — | — | 1.50 | — | 1.50 | — | — | — | — | — | 0 |
| | | 18 | 20 | 82 | | 75 | 51 | | — | — | — | 1.50 | 1.50 | — | — | — | — | — | 0 |
| | | 19 | 20 | 74 | | 90 | 49 | | — | 0.005 | 0.005 | — | 0.01 | — | — | — | — | — | 0 |
| | | 20 | 20 | 59 | | 91 | 87 | | — | 0.004 | 1.4 | — | 1.40 | — | — | — | — | — | 0 |
| | | 21 | 20 | 62 | | 59 | 79 | | — | — | 0.75 | 0.700 | 1.45 | — | — | — | — | — | 0 |
| | | 22 | 20 | 73 | | 61 | 88 | | — | 0.5 | — | — | 0.5 | — | — | — | — | — | 0 |
| | | 23 | 20 | 69 | | 45 | 69 | | — | 0.5 | — | — | 0.5 | — | — | — | — | — | 0 |
| | | 24 | 20 | 80 | | 60 | 79 | | — | 0.5 | — | — | 0.5 | 0.001 | — | — | — | — | 0.001 |
| | | 25 | 20 | 81 | | 65 | 68 | | — | 0.5 | — | — | 0.5 | — | 0.001 | — | — | — | 0.001 |
| | | 26 | 20 | 79 | | 55 | 78 | | — | 0.5 | — | — | 0.5 | — | — | 0.001 | — | — | 0.001 |
| | | 27 | 20 | 78 | | 90 | 71 | | — | 0.5 | — | — | 0.5 | — | — | — | 0.001 | — | 0.001 |
| | | 28 | 20 | 72 | | 76 | 76 | | — | 0.5 | — | — | 0.5 | — | — | — | — | 0.001 | 0.001 |
| | | 29 | 20 | 63 | | 45 | 92 | | — | 0.5 | — | — | 0.5 | 0.75 | — | — | — | — | 0.75 |
| | | 30 | 20 | 67 | | 40 | 86 | | — | 0.5 | — | — | 0.5 | — | 0.75 | — | — | — | 0.75 |
| | | 31 | 20 | 69 | | 41 | 98 | | — | 0.5 | — | — | 0.5 | — | — | 0.75 | — | — | 0.75 |
| | | 32 | 20 | 80 | | 41 | 71 | | — | 0.5 | — | — | 0.5 | — | — | — | 0.75 | — | 0.75 |
| | | 33 | 20 | 72 | | 56 | 65 | | — | 0.5 | — | — | 0.5 | — | — | — | — | 0.75 | 0.75 |
| | | 34 | 20 | 75 | | 64 | 50 | | — | 0.5 | — | — | 0.5 | 0.0005 | 0.0005 | — | — | — | 0.001 |
| | | 35 | 20 | 72 | | 75 | 63 | | — | 0.5 | — | — | 0.5 | — | — | 0.0005 | — | 0.0005 | 0.001 |
| | | 36 | 20 | 77 | | 77 | 59 | | — | 0.5 | — | — | 0.5 | — | — | — | 0.0005 | 0.0005 | 0.001 |
| | | 37 | 20 | 81 | | 84 | 86 | | — | 0.5 | — | — | 0.5 | 0.25 | 0.25 | — | — | — | 0.75 |
| | | 38 | 20 | 82 | | 90 | 76 | | — | 0.5 | — | — | 0.5 | — | — | 0.25 | — | 0.50 | 0.75 |
| | | 39 | 20 | 69 | | 40 | 84 | | — | 0.5 | — | — | 0.5 | — | 0.25 | — | — | 0.50 | 0.75 |
| | | 40 | 20 | 79 | | 46 | 52 | | — | 0.5 | — | — | 0.5 | — | — | — | 0.25 | 0.50 | 0.75 |
| | | 41 | 20 | 69 | | 55 | 56 | | — | — | 0.5 | — | 0.5 | 0.001 | 0.001 | — | — | — | 0.001 |
| | | 42 | 20 | 80 | | 68 | 92 | | — | — | 0.5 | — | 0.5 | — | — | 0.001 | — | — | 0.001 |
| | | 43 | 20 | 82 | | 69 | 86 | | — | — | 0.5 | — | 0.5 | — | — | — | — | — | 0.001 |

TABLE 1-continued

| No. | Wire diameter (μm) | Direction perpendicular to plane including wire center axis — Abundance ratios (%) of crystal orientations <110> and <111> | Direction of wire center axis — Abundance ratio of crystal orientation <100> | Direction of wire center axis — Abundance ratios (%) of crystal orientations <111> and <100> | Additive elements Ni | Pd | Pt | Au | Total | P | In | Ga | Ge | Ag | Total |
|---|---|---|---|---|---|---|---|---|---|---|---|---|---|---|---|
| 44 | 20 | 81 | 70 | 76 | — | — | 0.5 | — | 0.5 | — | — | — | 0.001 | — | 0.001 |
| 45 | 20 | 69 | 77 | 84 | — | — | 0.5 | — | 0.5 | — | — | — | — | 0.001 | 0.001 |
| 46 | 20 | 57 | 84 | 73 | — | — | 0.5 | — | 0.5 | 0.75 | — | — | — | — | 0.75 |
| 47 | 20 | 76 | 81 | 65 | — | — | 0.5 | — | 0.5 | — | 0.75 | — | — | — | 0.75 |
| 48 | 20 | 72 | 36 | 69 | — | — | 0.5 | — | 0.5 | — | — | 0.75 | — | — | 0.75 |
| 49 | 20 | 79 | 49 | 86 | — | — | 0.5 | — | 0.5 | — | — | — | 0.75 | — | 0.75 |
| 50 | 20 | 81 | 40 | 88 | — | — | 0.5 | — | 0.5 | — | — | — | — | 0.75 | 0.75 |
| 51 | 20 | 80 | 59 | 78 | — | — | 0.5 | — | 0.5 | 0.0005 | — | — | — | 0.0005 | 0.001 |
| 52 | 20 | 68 | 40 | 84 | — | — | 0.5 | — | 0.5 | — | 0.0005 | — | — | 0.0005 | 0.001 |
| 53 | 20 | 74 | 67 | 63 | — | — | 0.5 | — | 0.5 | — | — | 0.0005 | — | 0.0005 | 0.001 |
| 54 | 20 | 75 | 78 | 59 | — | — | 0.5 | — | 0.5 | — | — | — | 0.0005 | 0.0005 | 0.001 |
| 55 | 20 | 76 | 77 | 30 | — | — | 0.5 | — | 0.5 | 0.25 | — | — | — | 0.50 | 0.75 |
| 56 | 20 | 73 | 90 | 68 | — | — | 0.5 | — | 0.5 | — | 0.25 | — | — | 0.50 | 0.75 |
| 57 | 20 | 75 | 67 | 39 | — | — | 0.5 | — | 0.5 | — | — | 0.25 | — | 0.50 | 0.75 |
| 58 | 20 | 77 | 81 | 88 | — | — | 0.5 | — | 0.5 | — | — | — | 0.25 | 0.50 | 0.75 |
| 59 | 20 | 69 | 75 | 77 | — | — | — | — | 0 | 0.001 | — | — | — | — | 0.001 |
| 60 | 20 | 70 | 70 | 78 | — | — | — | — | 0 | — | 0.001 | — | — | — | 0.001 |
| 61 | 20 | 81 | 69 | 83 | — | — | — | — | 0 | — | — | 0.001 | — | — | 0.001 |
| 62 | 20 | 74 | 77 | 71 | — | — | — | — | 0 | — | — | — | 0.001 | — | 0.001 |
| 63 | 20 | 75 | 74 | 68 | — | — | — | — | 0 | — | — | — | — | 0.001 | 0.001 |
| 64 | 20 | 79 | 80 | 72 | — | — | — | — | 0 | 0.75 | — | — | — | — | 0.75 |
| 65 | 20 | 82 | 85 | 71 | — | — | — | — | 0 | — | 0.75 | — | — | — | 0.75 |
| 66 | 20 | 69 | 90 | 68 | — | — | — | — | 0 | — | — | 0.75 | — | — | 0.75 |
| 67 | 20 | 64 | 87 | 71 | — | — | — | — | 0 | — | — | — | 0.75 | — | 0.75 |
| 68 | 20 | 65 | 81 | 77 | — | — | — | — | 0 | — | — | — | — | 0.75 | 0.75 |
| 69 | 20 | 75 | 75 | 68 | — | — | — | — | 0 | 0.0005 | — | — | — | 0.0005 | 0.001 |
| 70 | 20 | 64 | 76 | 69 | — | — | — | — | 0 | — | 0.0005 | — | — | 0.0005 | 0.001 |
| 71 | 20 | 79 | 70 | 85 | — | — | — | — | 0 | — | — | 0.0005 | — | 0.0005 | 0.001 |
| 72 | 20 | 75 | 41 | 77 | — | — | — | — | 0 | — | — | — | 0.0005 | 0.0005 | 0.001 |
| Comparative Examples 1 | 20 | 39 | 15 | 20 | — | — | — | — | 0 | — | — | — | — | — | 0 |
| Comparative Examples 2 | 20 | 91 | 19 | 21 | — | — | — | — | 0 | — | — | — | — | — | 0 |

TABLE 2

| | No. | Wear of capillary (less than 3000 trials: 0 pts; 3000 or more and less than 5000:1 pt; 5000 or more and less than 7000: 2 pts; 7000 or more: 3 pts) | Window evaluation of wedge bonding (less than 40 conditions: 0 pts; 40 or more and less than 43: 1 pt; 43 or more and less than 45: 2 pts; 45 or more: 3 pts) | Wire damage in neck portions (2 or more defects: 0 pts; 1 defect: 1 pt; no defect: 2 pts) | Ball bond area life in high temperature storage test (less than 400 hours: 0 pts; 400 hours or more and less than 600 hours: 1 pt; 600 hours or more: 2 pts; 1000 hours or more: 3 pts) | Straightness of loops (3 or more defects: 0 pts; 2 defects: 1 pt; 1 defect: 2 pts; no defect: 3 pts) |
|---|---|---|---|---|---|---|
| Examples | 1 | 1 | 1 | 1 | 1 | 1 |
| | 2 | 1 | 1 | 1 | 1 | 1 |
| | 3 | 2 | 1 | 1 | 1 | 1 |
| | 4 | 2 | 1 | 1 | 1 | 1 |
| | 5 | 2 | 2 | 1 | 1 | 1 |
| | 6 | 2 | 2 | 1 | 1 | 1 |
| | 7 | 2 | 2 | 2 | 1 | 1 |
| | 8 | 2 | 2 | 2 | 1 | 1 |
| | 9 | 2 | 2 | 2 | 2 | 1 |
| | 10 | 2 | 2 | 2 | 3 | 1 |
| | 11 | 2 | 2 | 2 | 3 | 1 |
| | 12 | 2 | 2 | 2 | 2 | 1 |
| | 13 | 2 | 2 | 2 | 3 | 1 |
| | 14 | 2 | 2 | 2 | 3 | 1 |
| | 15 | 2 | 2 | 2 | 2 | 1 |
| | 16 | 2 | 2 | 2 | 3 | 1 |
| | 17 | 2 | 2 | 2 | 3 | 1 |
| | 18 | 2 | 2 | 2 | 2 | 1 |
| | 19 | 2 | 2 | 2 | 3 | 1 |
| | 20 | 2 | 2 | 2 | 3 | 1 |
| | 21 | 2 | 2 | 2 | 3 | 1 |
| | 22 | 2 | 2 | 2 | 3 | 1 |
| | 23 | 3 | 3 | 2 | 3 | 2 |
| | 24 | 3 | 3 | 2 | 3 | 2 |
| | 25 | 3 | 3 | 2 | 3 | 2 |
| | 26 | 3 | 3 | 2 | 3 | 2 |
| | 27 | 3 | 3 | 2 | 3 | 3 |
| | 28 | 3 | 3 | 2 | 3 | 2 |
| | 29 | 3 | 3 | 2 | 3 | 2 |
| | 30 | 3 | 3 | 2 | 3 | 2 |
| | 31 | 3 | 3 | 2 | 3 | 2 |
| | 32 | 3 | 3 | 2 | 3 | 3 |
| | 33 | 3 | 3 | 2 | 3 | 3 |
| | 34 | 3 | 3 | 2 | 3 | 3 |
| | 35 | 3 | 3 | 2 | 3 | 3 |
| | 36 | 3 | 3 | 2 | 3 | 3 |
| | 37 | 3 | 3 | 2 | 3 | 3 |
| | 38 | 3 | 3 | 2 | 3 | 3 |
| | 39 | 3 | 3 | 2 | 3 | 3 |
| | 40 | 3 | 3 | 2 | 3 | 3 |
| | 41 | 3 | 3 | 2 | 3 | 2 |
| | 42 | 3 | 3 | 2 | 3 | 2 |
| | 43 | 3 | 3 | 2 | 3 | 2 |
| | 44 | 3 | 3 | 2 | 3 | 2 |
| | 45 | 3 | 3 | 2 | 3 | 3 |
| | 46 | 3 | 3 | 2 | 3 | 2 |
| | 47 | 3 | 3 | 2 | 3 | 2 |
| | 48 | 3 | 3 | 2 | 3 | 2 |
| | 49 | 3 | 3 | 2 | 3 | 2 |
| | 50 | 3 | 3 | 2 | 3 | 3 |
| | 51 | 3 | 3 | 2 | 3 | 3 |
| | 52 | 3 | 3 | 2 | 3 | 3 |
| | 53 | 3 | 3 | 2 | 3 | 3 |
| | 54 | 3 | 3 | 2 | 3 | 3 |
| | 55 | 3 | 3 | 2 | 3 | 3 |
| | 56 | 3 | 3 | 2 | 3 | 3 |
| | 57 | 3 | 3 | 2 | 3 | 3 |
| | 58 | 3 | 3 | 2 | 3 | 3 |
| | 59 | 3 | 3 | 2 | 1 | 2 |
| | 60 | 3 | 3 | 2 | 1 | 2 |
| | 61 | 3 | 3 | 2 | 1 | 2 |
| | 62 | 3 | 3 | 2 | 1 | 2 |
| | 63 | 3 | 3 | 2 | 1 | 3 |
| | 64 | 3 | 3 | 2 | 1 | 2 |
| | 65 | 3 | 3 | 2 | 1 | 2 |
| | 66 | 3 | 3 | 2 | 1 | 2 |
| | 67 | 3 | 3 | 2 | 1 | 2 |
| | 68 | 3 | 3 | 2 | 1 | 3 |
| | 69 | 3 | 3 | 2 | 1 | 3 |
| | 70 | 3 | 3 | 2 | 1 | 3 |

TABLE 2-continued

| | | Evaluation results | | | | |
|---|---|---|---|---|---|---|
| | No. | Wear of capillary (less than 3000 trials: 0 pts; 3000 or more and less than 5000:1 pt; 5000 or more and less than 7000: 2 pts; 7000 or more: 3 pts) | Window evaluation of wedge bonding (less than 40 conditions: 0 pts; 40 or more and less than 43: 1 pt; 43 or more and less than 45: 2 pts; 45 or more: 3 pts) | Wire damage in neck portions (2 or more defects: 0 pts; 1 defect: 1 pt; no defect: 2 pts) | Ball bond area life in high temperature storage test (less than 400 hours: 0 pts; 400 hours or more and less than 600 hours: 1 pt; 600 hours or more: 2 pts; 1000 hours or more: 3 pts) | Straightness of loops (3 or more defects: 0 pts; 2 defects: 1 pt; 1 defect: 2 pts; no defect: 3 pts) |
| | 71 | 3 | 3 | 2 | 1 | 3 |
| | 72 | 3 | 3 | 2 | 1 | 3 |
| Comparative Examples | 1 | 0 | 1 | 1 | 1 | 1 |
| | 2 | 0 | 1 | 1 | 1 | 1 |

The invention claimed is:

1. A Cu alloy bonding wire for a semiconductor device, wherein the total of abundance ratios of crystal orientations <110> and <111> having an angular difference of 15 degrees or less from a direction perpendicular to one plane including a wire center axis to crystal orientations on a wire surface is 40% or more and 90% or less in average area percentage.

2. The Cu alloy bonding wire for a semiconductor device according to claim 1, wherein the abundance ratio of crystal orientation <100> having an angular difference of 15 degrees or less from the direction of the wire center axis to the crystal orientations on the wire surface is 30% or more and 100% or less in average area percentage.

3. The Cu alloy bonding wire for a semiconductor device according to claim 1, wherein a total of abundance ratios of crystal orientations <111> and <100> having an angular difference of 15 degrees or less from a direction of the wire center axis to crystal orientations in a section in a direction parallel to the wire center axis is 25% or more and 100% or less, in average area percentage.

4. The Cu alloy bonding wire for a semiconductor device according to claim 1, wherein the Cu alloy bonding wire contains one or more of Ni, Pd, Pt, and Au for a total of 0.01 mass% or more and 1.5 mass% or less and a balance being Cu and incidental impurities.

5. The Cu alloy bonding wire for a semiconductor device according to claim 1, wherein the Cu alloy bonding wire contains one or more of P, In, Ga, Ge, and Ag for a total of 0.001 mass% or more and 0.75 mass% or less and a balance being Cu and incidental impurities.

6. The Cu alloy bonding wire for a semiconductor device according to claim 4, wherein the Cu alloy bonding wire further contains one or more of P, In, Ga, Ge, and Ag for a total of 0.001 mass% or more and 0.75 mass% or less and a balance being Cu and incidental impurities.

* * * * *